United States Patent
Moehlmann

(10) Patent No.: US 7,221,726 B2
(45) Date of Patent: May 22, 2007

(54) ARRANGEMENT FOR GENERATING A DECODER CLOCK SIGNAL

(75) Inventor: Ulrich Moehlmann, Moisburg (DE)

(73) Assignee: NXP B.V., Eindhoven (NL)

( * ) Notice: Subject to any disclaimer, the term of this patent is extended or adjusted under 35 U.S.C. 154(b) by 656 days.

(21) Appl. No.: 10/180,402

(22) Filed: Jun. 26, 2002

(65) Prior Publication Data

US 2003/0003888 A1 Jan. 2, 2003

(30) Foreign Application Priority Data

Jun. 29, 2001 (DE) .............................. 101 31 445

(51) Int. Cl.
*H03D 3/24* (2006.01)
(52) U.S. Cl. ....................... 375/375; 375/373
(58) Field of Classification Search .................. 369/59; 348/515, 512, 6, 7, 12, 13, 423, 521; 375/362, 375/376, 374, 375–76, 373, 260, 354, 355, 375/371; 370/516; 713/500, 400; 358/1; 331/1 A, 2, 16–18, 25, 74; 327/105, 107, 327/156–159, 113, 115, 116, 117, 291, 298, 327/141, 144; 455/260, 258, 259, 256, 265, 455/70, 71
See application file for complete search history.

(56) References Cited

U.S. PATENT DOCUMENTS

| | | | | | |
|---|---|---|---|---|---|
| 5,703,537 | A | * | 12/1997 | Bland et al. ................. | 331/1 A |
| 6,151,479 | A | * | 11/2000 | Kummer ...................... | 725/70 |
| 6,522,278 | B1 | * | 2/2003 | Rhode et al. ................ | 341/144 |
| 6,531,975 | B1 | * | 3/2003 | Trotter et al. ................ | 341/144 |

* cited by examiner

*Primary Examiner*—Mohammed Ghayour
*Assistant Examiner*—Sophia Vlahos

(57) ABSTRACT

The invention relates to an arrangement for generating a decoder clock signal for decoding a data signal which is available together with a clock signal and a data word signal signalizing data words, both of which signals may each have different frequencies. The arrangement comprises a phase control circuit (1) which receives the clock signal and supplies the decoder clock signal from its output, and which comprises at least one adjustable divider (14) which is preferably arranged at the input of the phase control circuit (1) and whose division ratio is adjustable.

6 Claims, 2 Drawing Sheets

Figure 1:
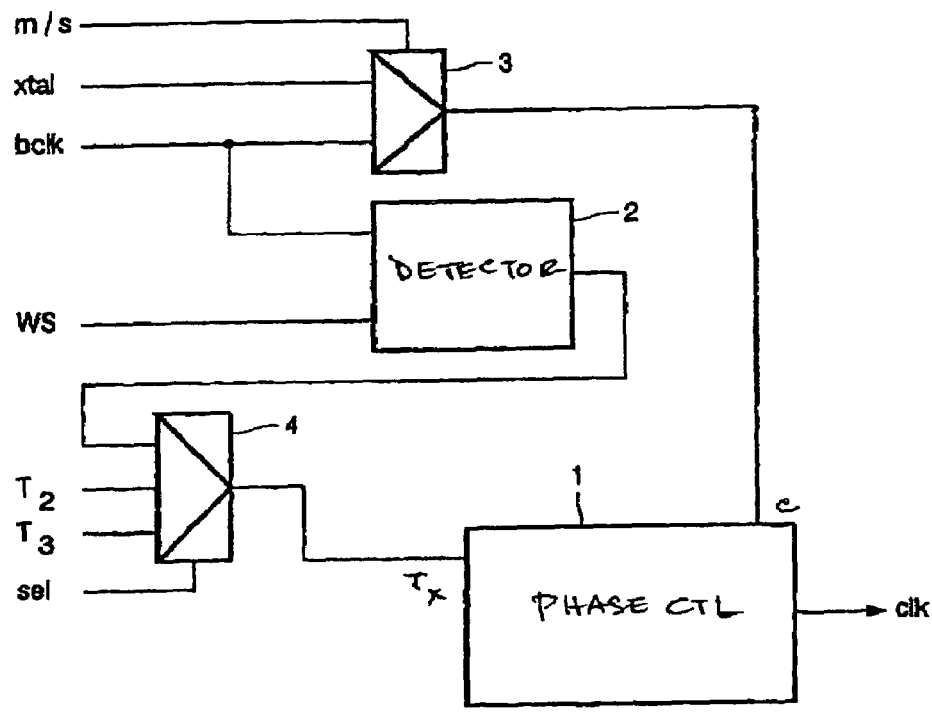

| | | | | WS = 32 kHz | | | WS = 44.1 kHz | | | WS = 48 kHz | | |
|---|---|---|---|---|---|---|---|---|---|---|---|---|
| $f_{bclk}/f_{WS}$ | m | n | p | $f_{bclk}$ / MHz | $f_{pd}$ / MHz | $f_{cco}$ / MHz | $f_{bclk}$ / MHz | $f_{pd}$ / MHz | $f_{cco}$ / MHz | $f_{bclk}$ / MHz | $f_{pd}$ / MHz | $f_{cco}$ / MHz |
| 256 | 576 | 16 | 72 | 8.192 | 0.512 | 294.912 | 11.2896 | 0.7056 | 406.4256 | 12.288 | 0.768 | 442.368 |
| 128 | 576 | 8 | 72 | 4.096 | 0.512 | 294.912 | 5.6448 | 0.7056 | 406.4256 | 6.144 | 0.768 | 442.368 |
| 64 | 576 | 4 | 72 | 2.048 | 0.512 | 294.912 | 2.8224 | 0.7056 | 406.4256 | 3.072 | 0.768 | 442.368 |
| 48 | 576 | 3 | 72 | 1.536 | 0.512 | 294.912 | 2.1168 | 0.7056 | 406.4256 | 2.304 | 0.768 | 442.368 |
| 32 | 576 | 2 | 72 | 1.024 | 0.512 | 294.912 | 1.4112 | 0.7056 | 406.4256 | 1.536 | 0.768 | 442.368 |
| 16 | 576 | 1 | 72 | 0.512 | 0.512 | 294.912 | 0.7056 | 0.7056 | 406.4256 | 0.768 | 0.768 | 442.368 |

FIG. 3

ARRANGEMENT FOR GENERATING A DECODER CLOCK SIGNAL

The invention relates to an arrangement for generating a decoder clock signal for decoding a data signal. This data signal is available with a given clock which is signalized by a clock signal. The data signal is subdivided into data words which are characterized by a data word signal.

On the one hand, the decoder clock signal should lock in on the frequency of the clock signal of the data signal, i.e. it should be oriented in accordance with the frequency of the clock signal. On the other hand, the value of the frequency of the decoder clock signal should be in a fixed, predetermined ratio with respect to the frequency of the data word signal. However, since the frequency of both the clock signal and the data word signal may change, there is the problem that the decoder clock signal should comply with the two above-mentioned conditions under all given frequency ratios of the two signals.

The data signal may be, for example, a digital sound signal for which a clock signal suitable for decoding should be made available. The sound signal may, however, be present in different clock signals. Furthermore, the data word signal may have different values, in which the data word signal signalizes the change between the two channels in each data word in the case of a sound signal. The frequency of the data word signal may then correspond to the sampling frequency of the sound signal.

Phase control circuits are known from the prior art in which one or more dividers having adjustable division ratios are provided. Such phase control circuits can thereby be implemented in such a way that they are designed for a given input frequency, a given output frequency or a given operating frequency.

It is an object of the invention to provide an arrangement of the type described in the opening paragraph for generating a decoder clock signal which is capable of adjusting itself automatically to different frequencies of the clock signal and the data word signal and of supplying a decoder clock signal which is in a fixed, predetermined frequency ratio with the relevant occurring frequency of the data word signal in the case of all occurring frequency ratios.

According to the invention, this object is achieved by the characteristic features of claim 1.

An arrangement for generating a decoder clock signal for decoding a data signal which is available together with a clock signal and a data word signal signalizing data words, both of which signals may each have different frequencies, the arrangement comprising a phase control circuit which receives the clock signal and supplies the decoder clock signal from its output, and which comprises at least one adjustable divider which is preferably arranged at the input of the phase control circuit and whose division ratio is adjustable, and a detector which determines at least the ratio between the frequency of the clock signal and the frequency of the data word signal and adjusts, in dependence upon this frequency ratio, the division ratio in the adjustable divider in such a way that the frequency of the decoder clock signal has a fixed, predetermined frequency ratio with respect to the frequency of the data word signal in the case of all possibly occurring frequency ratios between the clock signal and the data word signal.

The arrangement according to the invention comprises a phase control circuit which receives the clock signal. The phase control circuit comprises at least one adjustable divider which is preferably arranged at the input of the phase control circuit. The division ratio, with which this adjustable divider operates, is adjustable.

Since the phase control circuit receives the clock signal as an input signal, the phase control circuit operates in dependence upon the adjusted division ratio of the divider in a given frequency ratio with respect to the frequency of the clock signal. The output signal of the phase control circuit, representing the output signal of the arrangement and hence of the decoder clock signal, may have a different frequency than the clock signal but has a fixed frequency ratio with respect to this clock signal, i.e. it is locked in on the clock signal of the data signal.

The frequency of the decoder clock signal should, however, be in a fixed, predetermined frequency ratio with respect to the frequency of the data word signal. However, since the input of the phase detector does not receive this data word signal but the clock signal, the arrangement according to the invention comprises a detector which determines the ratio between the frequency of the clock signal and the frequency of the data word signal and adjusts the division ratio of the adjustable divider or dividers arranged in the phase control circuit in such a way that the frequency of the output signal of the phase control circuit and hence the frequency of the decoder clock signal has the fixed, predetermined frequency ratio with respect to the frequency of the data word signal in the case of all occurring frequency ratios between the clock signal and the data word signal.

In this way, it is achieved, on the one hand, that the decoder clock signal is locked in on the clock signal as regards its frequency and phase behavior. On the other hand, its frequency is in a fixed, predetermined frequency ratio with respect to the frequency of the data word signal.

All of this is achieved with a phase control circuit so that this has the particular advantage that it is not necessary to provide a plurality of phase control circuits that might influence each other.

Furthermore, the arrangement automatically adjusts itself to different frequencies of the clock signal and thus automatically supplies a decoder clock signal independently of the frequency of the clock signal, which decoder clock signal has the predetermined frequency ratio with respect to the data word signal but is locked on the clock signal.

Dependent on the value of the occurring frequencies and dependent on the operating frequency of the phase control circuit, it may advantageously comprise further dividers in accordance with an embodiment of the invention as defined in claim 2. Overall, three dividers may be provided, at least one of which, preferably the divider arranged at the input of the phase control circuit, is adjustable. The input frequency of the phase control circuit, its output frequency as well as its operating frequency can be adjusted as desired within wide ranges by the further dividers, and a minor adaptation to different frequency ratios is possible.

In accordance with a further embodiment of the invention as defined in claim 3, the detector does not need to recompute the division ratio for different occurring frequency ratios between the frequency of the clock signal and the frequency of the data word signal, but it can rather read these computation values from a table. Dependent on the determined frequency ratio, this table supplies the division ratios to be adjusted for the adjustable divider or dividers, which division ratios are thereupon adjusted accordingly by the detector.

In accordance with a further embodiment of the invention as defined in claim 4, the data signal is a sound signal. Particularly such sound signals may have different frequencies and different data word frequencies. Because of its automatic adjustment to the different frequencies, the arrangement according to the invention is particularly suitable for these different sound formats.

In addition to the first mode of operation of the arrangement according to the invention described so far, a further, second mode of operation of the arrangement as defined in claim 5 may be provided, in which the phase control circuit receives a signal generated by a quartz oscillator. The frequency of the output signal of the phase control circuit is to be adjusted by means of the adjustable division ratios in such a way that it has a given value. In this case, the decoder signal is not oriented with respect to the frequency of the clock signal, but the decoder signal rather has a fixed frequency which is independent of the frequency of the clock signal. In this second mode of operation, the arrangement according to the invention may be used, for example, for supplying a master frequency signal which is used for converting, i.e. sampling an analog sound signal in the digital range. The data signal is then available as a digital sound signal, whose sampling frequency is oriented with respect to the frequency of the decoder signal. The desired frequency ratios are thereby established automatically again. In this second mode of operation, the arrangement according to the invention thus does not lock in on the frequencies of the input signals but, conversely, the frequencies of the input signals are rather adjusted in dependence upon the operating frequency of the arrangement according to the invention. In both cases, the desired frequency ratios can be maintained.

It may occur that the determined frequency ratio between the frequency of the clock signal and the frequency of the data word signal does not correspond to any one of the predetermined nominal values. For this case, a third mode of operation is provided in accordance with a further embodiment of the invention as defined in claim 6, which third mode is chosen in this case. In this mode of operation, a microprocessor determines the value of the occurring frequency ratio and adjusts the division ratios of the adjustable divider or dividers in such a way that the desired, fixed frequency ratio between the frequency of the decoder clock signal and the frequency of the data word signal is maintained again. The arrangement according to the invention can be used even more universally by virtue of this third mode of operation, because even non-standard frequency ratios can be processed in this way.

These and other aspects of the invention are apparent from and will be elucidated with reference to the embodiments described hereinafter.

Figure 2:
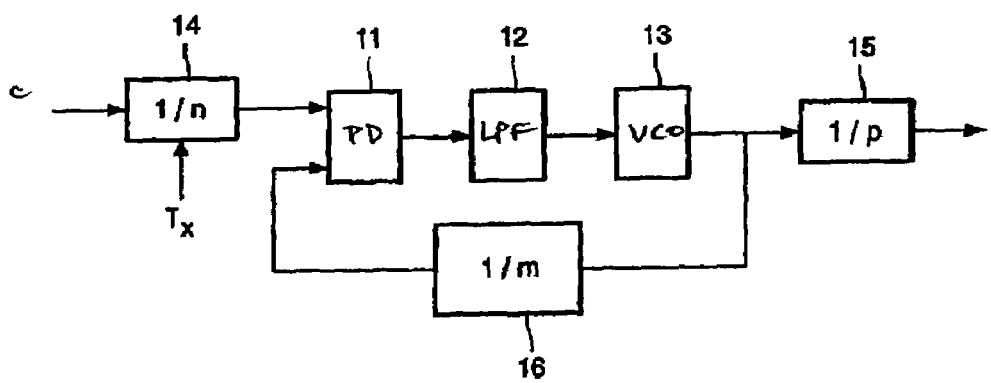

In the drawings:

FIG. 1 is a block diagram of an arrangement according to the invention for generating a decoder clock signal, using three possible modes of operation, FIG. 2 is a block diagram of a phase control circuit of the arrangement shown in FIG. 1, and FIG. 3 shows a Table with the possibly occurring frequencies and frequency ratios of the signals of the arrangement shown in FIG. 1 and the possible division ratios of the dividers of the phase control circuit shown in FIGS. 1 and 2.

FIG. 1 is a block diagram of an arrangement according to the invention for generating a decoder clock signal clk.

The frequency of the decoder clock signal clk should be in a given ratio with respect to the frequency of a data word signal WS, which signalizes each data word change in a data signal (not shown).

The data signal may be, for example, a digital sound signal which is present in a given clock and is signalized by a clock signal bclk. The data word signal WS not only signalizes the data word change but also the change of data between the two sound channels. Furthermore, the frequency of the data word signal WS corresponds to the sampling frequency of the sound signal.

The sound signal may be present at different frequencies, i.e. the frequency of the clock signal bclk may assume different predetermined values. In a corresponding manner, the frequency of the data word signal WS may also be dependent on the sampling frequency of the sound signal.

The frequency of the decoder clock signal clk should be in a given ratio with respect to the frequency of the data word signal WS. The decoder clock signal should, however, be locked in on the clock signal bclk, i.e. it should be oriented with respect to this clock signal as far as its frequency and phase are concerned. This, however, poses the problem that the clock signal bclk may assume different frequencies, independently of the frequency of the data word signal WS.

To solve this problem, a detector 2 is provided in addition to the phase control circuit 1 in the arrangement according to the invention, shown in FIG. 1. The clock signal bclk of the data signal (further not shown) and its data word signal WS are applied to the input of the detector 2. The detector 2 computes the frequency ratio between these two signals from which it determines those division ratios which are to be adjusted in the adjustable divider or dividers in the phase control circuit 1.

The signals bclk and WS already elucidated above are applied to the detector 2. Furthermore, a first multiplexer 3 is provided which is switchable by means of a mode signal m/s. The clock signal bclk and the clock signal xtal originating from a quartz oscillator (not shown) are applied to the first multiplexer 3. Dependent on the mode signal m/s, switching between these two clock signals takes place and the corresponding signal is applied to the phase control circuit 1.

A second multiplexer 4 is also provided, which has 3 inputs, one of which receives the output signal from the detector 2. Two further inputs receive input signals $T_2$ and $T_3$, which are division ratios to be adjusted in the adjustable dividers provided in the phase control circuit of FIG. 1. Switching between the output signal of the detector 2 and the signals $T_2$ and $T_3$ takes place by means of a switching signal sel.

This block diagram already shows that the arrangement of FIG. 1 can operate in three modes. First, the first mode of operation of the arrangement will be described, in which mode the arrangement will normally operate.

In this mode, the first multiplexer 3 is switched to its second input by means of the mode signal m/s so that the input of the phase control circuit 1 receives the clock signal bclk of the data signal. The phase control circuit is thus oriented with respect to this signal and locks in on this signal.

However, there is the problem that the frequency of the decoder clock signal clk should be in a given ratio with respect to the frequency of the data word signal WS, but the clock signal bclk may have different frequencies.

For this reason, the detector 2 determines the frequency ratio between the clock signal bclk and the data word signal WS from which it determines given division ratios which are supplied to the phase control circuit 1 via the multiplexer 4 by means of the accordingly adjusted switching signal sel. The phase control circuit 1 may comprise one or more adjustable dividers in a manner to be further elucidated hereinafter, whose division ratios are adjusted in accordance with this signal supplied by the detector 2. By a suitable choice of the division ratios, which will also be elucidated hereinafter, it can be achieved that the frequency of the decoder clock signal clk is in a given frequency ratio with respect to the frequency of the data word signal WS, but is oriented with respect to the clock signal bclk as regards its frequency and phase behavior, i.e. it is locked on this clock signal in a given frequency ratio.

Even for different frequencies of the clock signal bclk and hence for different frequency ratios between this signal and the data word signal WS, the detector 2 is thus always capable of maintaining the condition that the frequency of the decoder clock signal clk is in a given ratio with respect to the frequency of the data word signal WS.

This adjustment of the arrangement according to the invention is effected automatically, i.e. an automatic adaptation of the arrangement according to the invention to different frequency ratios takes place so that the conditions mentioned above are automatically maintained.

In any case, this is possible as long as the frequency ratios between the clock signal bclk and the data word signal WS comply with given standard-conforming values. Under special circumstances, it may occur that the frequency ratio between these two signals does not comply with the standard or assumes new, unknown values. The arrangement according to the invention, shown in FIG. 1, can then be switched to a third mode of operation which is effected by applying the switching signal sel to the third input of the second multiplexer 4 so that the adjustable division ratios are now determined by a signal $T_3$ which is applied to the corresponding adjustable dividers in the phase control circuit 1. In this mode of operation, the detector 2 thus no longer selects fixed, predetermined division ratios, but these division ratios are computed by an external microprocessor (not shown). The microprocessor computes the division ratios to be adjusted from the frequency of the clock signal clk and the frequency of the data word signal WS and adjusts the adjustable dividers in the phase control circuit 1 accordingly via the signal $T_3$.

Normally, this third mode of operation will not be the standard mode but will only be selected when the first mode of operation, in which the detector determines the division ratios, cannot be applied for reasons of non-conformity or new frequency ratios.

Furthermore, a second mode of operation is provided, in which the first multiplexer 3 is switched to its first input by means of the mode signal m/s and the second multiplexer 4 is switched to its input by means of the switching signal sel. In this mode of operation, the decoder clock signal clk is no longer oriented with respect to the clock signal bclk but with respect to a signal having a fixed frequency xtal which is supplied by a quartz oscillator (not shown). The adjustable dividers provided in the phase control circuit are further adjusted to given division ratios indicated by the signal $T_2$. These division ratios are chosen in such a way that, dependent upon the frequency of the signal xtal at the output of the phase control circuit 1, a decoder clock signal clk occurs at a desired, fixed frequency.

This second mode of operation can be advantageously chosen when the decoder clock signal should not be oriented with respect to the clock signal xtal of the data signal as regards its frequency and phase behavior but should itself be independent thereof and quasi-represent a master clock signal. This mode of operation may be chosen, for example, when the sound signal, which is not shown in the Figure, is produced by sampling an analog sound signal and when the sampling frequency is oriented with respect to the frequency of the decoder clock signal clk. In this case, the frequencies of the clock signal bclk and the data word signal WS are in a given ratio with respect to the decoder clock signal clk so that the frequency ratios described above are maintained again. However, in this mode of operation, the arrangement according to the invention quasi-supplies the master frequency to which the frequencies bclk and WS are oriented, whereas it is exactly the reverse case in the first mode of operation. In both cases, the result is that the frequency ratios described above are maintained.

FIG. 2 is a block diagram of the phase control circuit 1 shown in FIG. 1. The phase control circuit 1 shown in FIG. 2 comprises a phase detector 11, a filter 2 and a controlled oscillator 3. At the input, i.e. preceding the phase detector, a first, adjustable divider 14 is arranged, which receives a signal $T_x$ which is the output signal of the second multiplexer 4 of the arrangement shown in FIG. 1.

The division ratio, at which the adjustable divider 14 operates, is adjustable in dependence upon this signal $T_x$.

The phase detector shown in FIG. 2 comprises two further dividers 15 and 16 which are, however, not chosen to be adjustable, but have a fixed division ratio.

The second divider 15 is arranged at the output of the phase detector, i.e. behind its controllable oscillator 13 and supplies the output signal of the phase control circuit.

The third divider 16 is arranged in the feedback loop of the phase control circuit, i.e. between the output of the controllable oscillator 13 and the second input of the phase detector 11.

As already explained above, the adjustable divider 14 operates in dependence upon the signal $T_x$, which, in the first mode of operation of the circuit of FIG. 1, means that this division ratio is determined by the detector 2.

In the embodiment shown in the Figure, the two further dividers 15 and 16 operate with fixed division ratios. In other embodiments, it is of course possible to give these dividers 15 and 16 also adjustable division ratios and, in the first mode of operation of the arrangement of FIG. 1, to have their division ratios also predetermined by the detector 2. FIG. 3 shows a Table which represents different frequency ratios and division ratios of the arrangement shown in FIGS. 1 and 2.

The first column of the Table states the frequency ratio between the clock signal bclk and the data word signal WS. This column shows that this frequency ratio may assume very different values. The further columns 2, 3 and 4 are denoted by m, n, p, which are divisors with which the dividers 14, 15 and 16 of the phase control circuit of FIG. 2 and also of the phase control circuit 1 of FIG. 1 operate. These divisors determine the division ratios of these dividers 14, 15 and 16.

These divisors are supplied by the detector 2 in the first mode of operation of the circuit arrangement of FIG. 1. In the two other modes of operation, these divisors are determined by the signals $T_2$ and $T_3$.

The Table in FIG. 3 shows that it is sufficient for the embodiment to have a variable value of the divisor n, i.e. to have it predetermined by the detector 2. On the other hand, the division ratios of the dividers 15 and 16 of the phase control circuit shown in FIG. 2 can be maintained constant.

This is possible because, for the different frequencies of the data word signal WS denoted by 32 kHz, 44.1 kHz and 48 kHz in Table 3, the condition can still be maintained that the decoder clock signal clk of the arrangement shown in FIG. 1 is in a given frequency ratio with respect to the frequency of the data word signal WS, and that the operating frequency of the phase control circuit 1 of FIG. 1 or the phase control circuit in FIG. 2 can be maintained in a nominal operating frequency range of the phase control circuit.

Columns 5, 6 and 7 of the Table in FIG. 3 show, for the frequencies 32 kHz of the data word signal WS and for the different frequency ratios in accordance with the first column, the occurring frequencies of the clock signal bclk, the frequency at the input of the phase detector 11 shown in FIG. 2 and the frequency at the output of the phase control circuit of FIG. 2 or the phase control circuit 1 of FIG. 1. The corresponding frequency ratios are shown in columns 8 to 13 in a corresponding way for the frequencies 44.1 kHz and 48 kHz of the data word signal.

The Table in FIG. 3 shows that the frequency of the output signal of the phase control circuit is always in a given ratio with respect to the frequency of the data word signal WS, independent of the frequency ratio between the clock signal bclk and the data word signal WS, i.e. independent of the frequency of the clock signal.

The detector 2 can directly derive, from an incorporated table, the values of the division ratios m, n, p shown in the Table of FIG. 3, i.e. these values do not need to be recomputed for every occurring division ratio but can be directly adjusted.

The third mode of operation described above should be used when none of the division ratios provided in the first column of the Table of FIG. 3 is present, but when deviating or new division ratios occur. The values of the division ratios m, n and p should then be computed and adjusted by a microprocessor in accordance with the really occurring division ratio.

The arrangement according to the invention yields a decoder clock signal clk which is locked on the clock signal bclk as regards its phase behavior, independently of its frequency. The arrangement is rather configured automatically in such a way that the frequency of this signal is always in a predetermined ratio with respect to the frequency of the data word signal WS. The decoder clock signal is thereby ideally suitable for decoding the data signal.

The invention claimed is:

1. An arrangement for generating a decoder clock signal for decoding a data signal which is available together with a clock signal and a data word signal signalizing data words, both of which signals may each have different frequencies, the arrangement comprising: a phase control circuit which receives the clock signal and supplies the decoder clock signal from its output, and which comprises at least one adjustable divider which is preferably arranged at the input of the phase control circuit and whose division ratio is adjustable, and a detector which determines at least the ratio between the frequency of the clock signal and the frequency of the data word signal and adjusts, in dependence upon this frequency ratio, the division ratio in the adjustable divider in such a way that the frequency of the decoder clock signal has a fixed, predetermined frequency ratio with respect to the frequency of the data word signal in the case of all possibly occurring frequency ratios between the clock signal and the data word signal.

2. An arrangement as claimed in claim 1, characterized in that the arrangement comprises three dividers, one of which is arranged at the input and at the output of the phase control circuit and one is arranged in the feedback loop of the phase control circuit between its controlled oscillator and its phase comparator, and at least one of which, preferably the divider arranged at the input of the phase control circuit, has an adjustable division ratio.

3. An arrangement as claimed in claim 1, characterized in that a table is provided from which a suitable value of the division ratio for the adjustable divider or dividers is obtainable for every possibly occurring frequency ratio between the frequency of the clock signal and the frequency of the data word signal.

4. An arrangement as claimed in claim 1, characterized in that the data signal is a digital sound signal and the data word signal has a frequency corresponding to the sampling frequency of the digital sound signal.

5. An arrangement as claimed in claim 4, characterized in that a second mode of operation is provided in which the phase control circuit in the arrangement receives a quartz oscillator signal instead of the clock signal and in which the division ratios of the variable dividers are adjusted at predetermined values which are chosen to be such that the frequency of the output signal of the phase control circuit has a predetermined value.

6. An arrangement as claimed in claim 1, characterized in that a third mode of operation is provided which is chosen when the occurring frequency ratio between the frequency of the clock signal and the frequency of the data word signal does not have any of a plurality of predetermined nominal values.

* * * * *